United States Patent
Tsuchiya et al.

(10) Patent No.: US 8,835,930 B2
(45) Date of Patent: Sep. 16, 2014

(54) GALLIUM NITRIDE RECTIFYING DEVICE

(75) Inventors: Tadayoshi Tsuchiya, Ishioka (JP);
Naoki Kaneda, Tsuchiura (JP);
Tomoyoshi Mishima, Shiki (JP)

(73) Assignee: Hitachi Metals, Ltd., Tokyo (JP)

( * ) Notice: Subject to any disclaimer, the term of this patent is extended or adjusted under 35 U.S.C. 154(b) by 168 days.

(21) Appl. No.: 13/426,527

(22) Filed: Mar. 21, 2012

(65) Prior Publication Data

US 2013/0001585 A1 Jan. 3, 2013

(30) Foreign Application Priority Data

Jun. 28, 2011 (JP) .................. 2011-142520

(51) Int. Cl.

| H01L 29/15 | (2006.01) |
| H01L 31/0256 | (2006.01) |
| H01L 33/00 | (2010.01) |
| H01L 29/20 | (2006.01) |
| H01L 29/30 | (2006.01) |
| H01L 29/861 | (2006.01) |
| H01L 33/32 | (2010.01) |

(52) U.S. Cl.
CPC .......... *H01L 29/861* (2013.01); *H01L 33/0004* (2013.01); *H01L 33/32* (2013.01); *H01L 29/2003* (2013.01)
USPC ............. 257/76; 257/103; 257/615; 257/617; 257/E33.025

(58) Field of Classification Search
None
See application file for complete search history.

(56) References Cited

U.S. PATENT DOCUMENTS

| 3,646,406 A * | 2/1972 | Logan et al. ................ 257/87 |
| 2009/0309124 A1* | 12/2009 | Wu et al. .................... 257/99 |
| 2010/0301351 A1 | 12/2010 | Flynn et al. |
| 2012/0146048 A1* | 6/2012 | Kato et al. .................. 257/76 |

FOREIGN PATENT DOCUMENTS

| JP | 2005-530334 A | 10/2005 |
| JP | 2007-234907 A | 9/2007 |
| WO | WO 03/094240 A1 | 11/2003 |

OTHER PUBLICATIONS

B. Jayant Baliga. Power Semiconductor Device Figure of Merit for High-Frequency Applications. Oct. 1989. IEEE Electron Device Letters. vol. 10. No. 10. pp. 455-457.*
Kozodoy et al. Electrical characterization of GaN p-n junctions with and without threading dislocations. Aug. 17, 1998. Applied Physics Letters. vol. 73. No. 7. pp. 975-977.*
Weimann et al. Scattering of electrons at threading dislocations in GaN. Apr. 1, 1998. Journal of Applied Physics. vol. 83. No. 7. pp. 3656-3659.*
Hierro et al. Optically and thermally detected deep levels in n-type Schottky and p+-n GaN diodes. May 22, 2000. Applied Physics Letters. vol. 76, No. 21. pp. 3064-3066.*
J. W. Johnson et al., "Breakdown Voltage and Reverse Recovery Characteristics of Free-Standing GaN Schottky Rectifiers", IEEE Trans. Electron Device, ED-49 (Jan. 2002), 32)).
N. Ikeda et al., "High power AlGaN/GaN HFET with a high breakdown voltage of over 1.8 kV on 4 inch Si substrates and the suppression of current collapse", ISPSD May 18-22, 2008, Orlando Florida, p. 289)).

* cited by examiner

*Primary Examiner* — Hoang-Quan Ho
(74) *Attorney, Agent, or Firm* — McGinn IP Law Group, PLLC

(57) ABSTRACT

A gallium nitride rectifying device includes a p-type gallium nitride based semiconductor layer and an n-type gallium nitride based semiconductor layer, the two layers forming a pn junction with each other. The p-type gallium nitride based semiconductor layer has a carrier trap (level) density of not more than $1 \times 10^{18}$ cm$^{-3}$, or the n-type gallium nitride based semiconductor layer has a carrier trap (level) density of not more than $1 \times 10^{16}$ cm$^{-3}$.

6 Claims, 4 Drawing Sheets

GALLIUM NITRIDE RECTIFYING DEVICE

The present application is based on Japanese patent application No. 2011-142520 filed on Jun. 28, 2011, the entire contents of which are incorporated herein by reference.

BACKGROUND OF THE INVENTION

1. Field of the Invention

This invention relates to a gallium nitride rectifying device using a gallium nitride based semiconductor.

2. Description of the Related Art

A gallium nitride (GaN) has a wider bandgap width and a higher breakdown field intensity than those of silicon (Si), and has an excellent heat resistance, thus it is suitable for a semiconductor material directed at a high-power electronic device such as a rectifying device and a transistor. For example, in a pn junction diode that is a typical rectifying device. GaN is overwhelmingly excellent in properties in comparison with not only Si that is a conventional material but also silicon carbide that is recently developed extensively.

FIG. 4 is a graph showing a relationship in theoretical limitation between a breakdown voltage of the pn junction diode and an on resistance of the device (for example, refer to a nonpatent literature 1 (J. W. Johnson et al., IEEE Trans. Electron Device, ED-49 (2002), 32)). Further, the theoretical limitation of FIG. 4 shows an on resistance in a simple structure to which microfabrication such as a trench structure is not applied. There is a trade-off relationship between a high breakdown voltage and a low on resistance that are needed for a high-power device. In FIG. 4, comparing between the same breakdown voltages, GaN has an on resistance of not more than 0.1% of Si, thus it is expected that loss can be extremely reduced.

In recent years, it is reported that a device having characteristics superior to Si by using GaN is going to be realized (for example, refer to a nonpatent literature 2 (N. Ikeda et al., ISPSD 2008, p. 289)).

In addition, in Si, a structure enhanced in a performance by that microfabrication such as a super junction (SJ) structure is applied thereto is developed. It is considered that this structure is also effectively used in the other material systems, thus a similar effect on performance enhancement can be expected. Consequently, microfabrication itself does not close the performance gap provided by the material characteristics. Namely, it is quite possible to extend a performance of a GaN device beyond the performance limitation shown in FIG. 4 by structural contrivance.

JP-A-2007-234907 (patent literature 1) discloses that a concentration of acceptor impurity included for the purpose of heightening the breakdown voltage (reverse voltage resistance) or for the other purpose is controlled to less than $1 \times 10^{19}$ cm$^{-3}$.

JP-T-2005-530334 (patent literature 2) discloses that a high breakdown voltage can be realized by controlling a dislocation density in crystal to not more than $5 \times 10^6$ cm$^{-2}$.

SUMMARY OF THE INVENTION

Conventionally, Si has been used for a pn junction type rectifying device, so-called pn junction diode, aimed at rectifying alternate current. Si is an indirect transition type semiconductor material, thus recombination probability of electron-hole pair is extremely small, and minority carrier lifetime is long. Consequently, if high current is applied, and carrier is injected at high concentration, both of electron and hole flow as diffusion current without recombining with each other, thus conductivity is increased and conductivity modulation is generated. A silicon carbide (SiC) semiconductor that is recently developed extensively is also an indirect transition type semiconductor material, thus it is said that similar conductivity modulation is generated.

On the other hand, GaN that is excellent in properties in comparison with Si and SiC, and is expected to have high characteristics as a rectifying device is a direct transition type semiconductor different from Si and SiC, thus GaN has an extremely high recombination velocity. Minority carrier lifetime thereof is extremely shorter and diffusion length thereof is shorter than Si and SiC. Consequently, diffusion current is low and conductivity modulation is hard to be generated.

In addition, an acceptor-type impurity doped for forming a p-type GaN forms an acceptor level at an energy position considerably deeper than thermal energy of 25 meV at room temperature, thus it is hard to discharge hole, consequently, it has a disadvantage that the carrier concentration of p-type layer becomes low and the resistance ratio thereof becomes high. Accordingly, the on resistance is also hard to be lowered as the whole device. For example, as described above, the patent literature 1 discloses that a concentration of acceptor impurity included for the purpose of heightening the breakdown voltage (reverse voltage resistance) or for the other purpose is controlled to less than $1 \times 10^{19}$ cm$^{-3}$, however, even though the breakdown voltage is less than 1 kV, the on resistance is extremely high as 6.3 mΩcm$^2$, that is far removed from an ideal value expected from the properties. If the breakdown voltage is positioned at such a level, the ideal value expected from the properties is supposed to become not more than 1 mΩcm$^2$, therefore, this shows that there is a large technical problem in reducing the on resistance.

As described above, the patent literature 2 discloses that a high breakdown voltage can be realized by controlling a dislocation density in crystal to not more than $5 \times 10^6$ cm$^{-2}$, but it has no description about the on resistance that is the most important characteristic in the device characteristics. As a matter of course, there is no description about a factor that has a decisive influence on the on resistance. Even though there is a description about sheet resistance in the patent literature 2, the sheet resistance only reflects information of a layer having the lowest resistance ratio, thus it does not reflect information of a layer having the highest resistance ratio, the layer having a decisive influence on the on resistance, consequently, this shows that the inventors of the patent literature 2 are not aware of the importance of the on resistance.

According to the above, it has been found that in the GaN rectifying device, the loss is not as much reduced as it has been initially expected, and the importance thereof is not sufficiently considered. The on resistance has a trade-off relationship between the breakdown voltage, and performance is often shown as figure of merit (Baliga's figure of merit) that is calculated by dividing square of the device breakdown voltage by the on resistance. The Baliga's figure of merit is needed to be improved.

Mostly, the carrier recombination that is easily generated when current is applied and considered to be source of the loss, not only generates heat and elevates the temperature of the device so as to increase the loss, but also causes time degradation in characteristics of the device. Consequently, it has been thought in the past that in the rectifying device, diffusion current should be increased by preventing the carrier recombination thoroughly.

Accordingly, it is an object of the invention to provide a gallium nitride rectifying device that allows a reduction in time degradation and a low loss (i.e., Baliga's figure of merit of not less than 1.5 GW/cm$^2$).

In order to solve the above-mentioned problem, the inventors et al. have conceived the present invention that positively adopts, contrary to the previous thought, the radiative recombination phenomenon that has been considered as one of the losses of the pn junction diode. Namely, it is considered that if the carrier trap (level) density is reduced and a light emission is carried out while non-radiative recombination is prevented, energy discharged by the recombination becomes a light instead of heat, thus heat generation is prevented, so that the on resistance can be reduced. In addition, the light emission is absorbed in the p-type layer, so that excitation of hole from a deep acceptor level can be accelerated, and a concentration of hole can be increased. According to verification of the invention, the on resistance is reduced and current is increased effectively. The on resistance has a trade-off relationship between the breakdown voltage, and performance is often shown as figure of merit (Baliga's figure of merit (BFOM)) that is calculated by dividing square of the device breakdown voltage by the on resistance. According to the invention, the BFOM can be enhanced, and the conventional limitation performance can be improved.

(1) According to one embodiment of the invention, a gallium nitride rectifying device comprises:
a p-type gallium nitride based semiconductor layer and an n-type gallium nitride based semiconductor layer, the two layers forming a pn junction with each other;
wherein the p-type gallium nitride based semiconductor layer has a carrier trap (level) density of not more than $1 \times 10^{18}$ cm$^{-3}$, or the n-type gallium nitride based semiconductor layer has a carrier trap (level) density of not more than $1 \times 10^{16}$ cm$^{-3}$.

In the above embodiment (1) of the invention, the following modifications and changes can be made.

(i) The p-type gallium nitride based semiconductor layer has the carrier trap (level) density of not more than $1 \times 10^{18}$ cm$^{-3}$, and the n-type gallium nitride based semiconductor layer has the carrier trap (level) density of not more than $1 \times 10^{16}$ cm$^{-3}$.

(ii) The p-type gallium nitride based semiconductor layer has the carrier trap (level) density of not more than $1 \times 10^{17}$ cm$^{-3}$, and the n-type gallium nitride based semiconductor layer has the carrier trap (level) density of not more than $1 \times 10^{15}$ cm$^{-3}$.

(iii) The p-type gallium nitride based semiconductor layer has the carrier trap (level) density of not more than 35% of a concentration of doped acceptor impurity, or the n-type gallium nitride based semiconductor layer has the carrier trap (level) density of not more than 35% of a concentration of doped donor impurity.

(iv) The p-type gallium nitride based semiconductor layer has the carrier trap (level) density of not more than 35% of a concentration of doped acceptor impurity, and the n-type gallium nitride based semiconductor layer has the carrier trap (level) density of not more than 35% of a concentration of doped donor impurity.

(v) The gallium nitride rectifying device is configured to be capable of emitting a light by power distribution.

(vi) The light output by the power distribution is more than 0.1 nW/cm$^2$, and less than 0.1 W/cm$^2$.

(vii) The gallium nitride rectifying device is configured to have a figure of merit of not less than $1.5 \times 10^9$ W/cm$^2$, where the figure of merit is calculated by dividing square of a device breakdown voltage by an on resistance.

(viii) The gallium nitride rectifying device is configured to have a figure of merit of not less than $4 \times 10^9$ W/cm$^2$, where the figure of merit is calculated by dividing square of a device breakdown voltage by an on resistance.

Effects of the Invention

According to one embodiment of the invention, a gallium nitride rectifying device can be provided that allows a reduction in time degradation and a loss (i.e., Baliga's figure of merit of not less than 1.5 GW/cm$^2$).

BRIEF DESCRIPTION OF THE DRAWINGS

The preferred embodiments according to the invention will be explained below referring to the drawings, wherein.

DETAILED DESCRIPTION OF THE PREFERRED EMBODIMENTS

Figure 1:
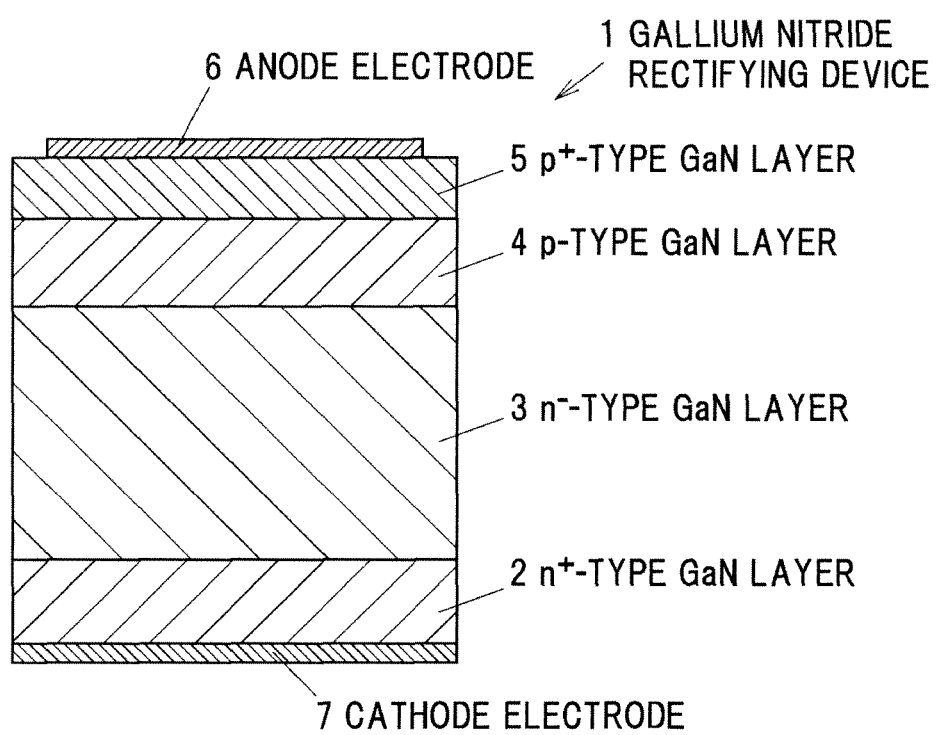
FIG. 1 is a cross-sectional view schematically showing a gallium nitride rectifying device according to one embodiment of the invention.

The preferred embodiments according to the invention will be explained below referring to the drawings.

Summary of Embodiments

A gallium nitride rectifying device according to the embodiment comprises a p-type gallium nitride based semiconductor layer and an n-type gallium nitride based semiconductor layer, the two layers forming a pn junction with each other, wherein the p-type gallium nitride based semiconductor layer has a carrier trap (level) density of not more than $1 \times 10^{18}$ cm$^{-3}$, or the n-type gallium nitride based semiconductor layer has a carrier trap (level) density of not more than $1 \times 10^{16}$ cm$^{-3}$.

Here, the "gallium nitride based semiconductor layer" means a semiconductor layer including gallium nitride, such as GaN, GaAlN, InGaN, InGaAlN.

If the p-type gallium nitride based semiconductor layer or the n-type gallium nitride based semiconductor layer is reduced in the carrier trap (level) density, the non-radiative recombination is prevented, and heat generation is prevented. As a result, time degradation due to heat is reduced, the on resistance is lowered and Baliga's figure of merit is enhanced.

Embodiments

FIG. 1 is a cross-sectional view schematically showing a gallium nitride rectifying device according to one embodiment of the invention. The gallium nitride rectifying device 1 (hereinafter, may be merely referred to as "device 1") is constructed mainly from a pn junction diode, and includes an n$^+$-type GaN layer (first layer) 2, an n$^-$-type GaN layer (second layer) 3, a p-type GaN layer (third layer) 4, a p$^+$-type GaN layer (fourth layer) 5, an anode electrode 6 and a cathode electrode 7.

The n$^+$-type GaN layer 2 and the n$^-$-type GaN layer 3 preferably have the carrier trap density located at an energy position deeper than donor level, of not more than $1\times10^{16}$ cm$^{-3}$, more preferably not more than $1\times10^{15}$ cm$^{-3}$, as the sum thereof.

In addition, the n$^+$-type GaN layer 2 and the n$^+$-type GaN layer 3 that are an n-type layer preferably have the carrier trap (level) density of not more than 35% of a concentration of doped donor impurity, as the sum thereof. The n$^+$-type GaN layer 2 according to the embodiment has a concentration of donor impurity of, for example, $2\times10^{18}$ cm$^{-3}$, and the n$^-$-type GaN layer 3 has a concentration of donor impurity of, for example. $2\times10^{17}$ cm$^{-3}$.

The p-type GaN layer 4 and the p$^+$-type GaN layer 5 preferably have the carrier trap (level) density located at an energy position deeper than acceptor level, of not more than $1\times10^{18}$ cm$^{-3}$, more preferably not more than $1\times10^{17}$ cm$^{-3}$, as the sum thereof.

In addition, the p-type GaN layer 4 and the p$^+$-type GaN layer 5 that are a p-type layer preferably have the carrier trap (level) density of not more than 35% of a concentration of doped acceptor impurity, as the sum thereof. The p-type GaN layer 4 according to the embodiment has a concentration of acceptor impurity of, for example, $2\times10^{19}$ cm$^{-3}$, and the p$^+$-type GaN layer 5 has a concentration of acceptor impurity of, for example, $2\times10^{20}$ cm$^{-3}$.

In addition, it is preferable that a value (figure of merit) calculated by dividing square of the device breakdown voltage by the on resistance is not less than $1.5\times10^9$ W/cm$^2$ ($1.5\times$GW/cm$^2$).

GaN is a direct transition semiconductor, thus it is not easy to reduce recombination probability and extend minority carrier lifetime. Consequently, the embodiment provides a method that is capable of reducing the on resistance, regardless of whether the diffusion current is large or small, even if the recombination probability is not changed.

Significance of Numerical Number Range

The carrier recombination includes a radiative recombination and a non-radiative recombination. It is not necessarily clear how each of these has an influence on the on resistance. In the embodiment, it has been found that the carrier trap (level) density existing in the band gap is reduced, thereby the on resistance is reduced. Generally, it is said that even if the carrier trap (level) density is reduced, the reduction of the carrier trap (level) density does do nothing other than changing recombination via the trap into recombination between the bands, and the recombination probability itself is not changed.

However, according to investigation of the inventors et al., it is presumed that if the carrier trap (level) density is reduced, relative proportion of the non-radiative recombination is reduced. As evidence of the above, when current is applied, it may be observed that the light emission is leaked from the device 1, although it is not much. It is considered that a part or most part of the light emission is absorbed into the p-type layer in the crystal or the like without being discharged outside of the chip, and engages in the excitation of carrier from the acceptor level or the like. In addition, it is considered that due to the above, the resistance ratio of the p-type layer that dominantly contributes to the on resistance is lowered, and the on resistance is reduced.

Further, an acceptor-type impurity such as magnesium, carbon, zinc used for the gallium nitride based material is a source of carrier supply in a p-type semiconductor, and every one of them forms the acceptor level at an energy level deeper than thermal energy at room temperature, thus generally, it is hard to be ionized, in other words, it is hard to discharge the carrier. Dependent on the concentration of the impurity, basically it only discharges the carrier of about 10% of the doping concentration. Consequently, the resistance ratio of the p-type layer becomes one of dominant factors for the on resistance at the time of forming the pn junction.

Proper defect in the crystal or the carrier trap level by impurities is broadly changed by a kind of substrate used, a growth method and a growth condition and the like. In this case, the "carrier trap level" means that all of the levels that trap majority carrier such as a residual acceptor impurity level in the n-type layer, a residual donor impurity level in the p-type layer are included in the carrier trap level.

The on resistance has a trade-off relationship between the breakdown voltage, thus "figure of merit" that is calculated by dividing square of the device breakdown voltage by the on resistance is often used as performance of the diode. In GaN, if the figure of merit is more than 1.5 GW/cm$^2$, it can be said that drastic improvement has been carried out in comparison with conventional devices. In the embodiment, if the carrier trap (level) density in the p-type layer is controlled to not more than $1\times10^{18}$ cm$^{-3}$, or the carrier trap (level) density in the n-type layer is controlled to not more than $1\times10^{16}$ cm$^{-3}$, it becomes possible to realize the figure of merit of not less than 1.5 GW/cm$^2$. More preferably, if the carrier trap (level) density in the p-type layer is controlled to not more than $1\times10^{17}$ cm$^{-3}$, and the carrier trap (level) density in the n-type layer is controlled to not more than $1\times10^{15}$ cm$^{-3}$, the on resistance is reduced up to around the theoretical value, and the figure of merit becomes not less than 4 GW/cm$^2$, so that a diode in which loss is extremely lowered can be realized.

Also, in case of lowering the doping concentration so as to obtain a high breakdown voltage, the trap level density is reduced to not more than approximately 35% of the concentration of the donor impurity or the acceptor impurity deliberately doped into the layer in which the trap exists, thereby the on resistance of the device can be relatively reduced, and the device can be drastically improved in characteristics thereof.

In the embodiment, in association with the carrier recombination, a light emission is observed inside of the device, thus it is considered that the intensity thereof also engages in it. It is considered that a method of radiating a light by an external light source exerts a certain amount of effect, for the purpose of obtaining the same effect, but the method of adding the external light source increases the production cost of the device, thus it is insufficient for the fabrication technique of rectifying diode.

Manufacturing Method of Gallium Nitride Rectifying Device

Next, an example of a manufacturing method of the gallium nitride rectifying device 1 will be explained.

As a substrate, a GaN substrate, a sapphire substrate, a SiC substrate, or a Si substrate is prepared. Next, on the substrate, the n$^+$-type GaN layer 2 that has the donor impurity concentration of $2\times10^{18}$ cm$^{-3}$ is grown by using Vapor-Phase Epitaxial method that uses an ammonia gas and an organic Ga material or a Ga chloride, namely Metal Organic Vapor-Phase Epitaxial (MOVPE) method or Hydride Vapor-Phase Epitaxial (HVPE) method, after that, the n$^-$-type GaN layer 3 in which the donor impurity concentration is reduced to $2\times10^{17}$ cm$^{-3}$ is grown, in addition, the p-type GaN layer 4 into which the acceptor impurity of $2\times10^{19}$ cm$^{-3}$ is doped and the p$^+$-type GaN layer 5 into which the acceptor impurity of $2\times10^{20}$ cm$^{-3}$ is doped are sequentially grown.

As the donor impurity, Si is used, and as the acceptor impurity, Mg is used. The control temperature during the formation of the film is set to 900 to 1100 degrees C.

Next, in case that a sapphire substrate, a SiC substrate, or a Si substrate is used as the substrate, considering heat radiation when the device generates heat, after the substrate is removed by separation, grinding or etching, a damaged layer of the surface is further removed by etching or the like, and the cathode electrode 7 is formed on the $n^+$-type GaN layer 2, and the anode electrode 6 is formed on the $p^+$-type GaN layer 5.

The same method is also adopted in a case that a GaN substrate is used as the substrate, but there is a case that an n-type GaN substrate is obtained, from which the substrate and the damaged layer are not completely removed, since an interface between the substrate and the epitaxial layer is not clear. After that, by using Vapor Deposition method, Photolithography method and the like, the gallium nitride rectifying device 1 of a pn junction diode structure having an ohmic electrode as shown in FIG. 1 is manufactured.

Advantages of the Embodiment

According to the embodiment, the carrier trap (level) density of the p-type layer or the n-type layer is reduced, so that a gallium nitride rectifying device in which time degradation is reduced and loss is lowered can be provided (i.e., Baliga's figure of merit of not less than 1.5 $GW/cm^2$).

EXAMPLES

Figure 2:
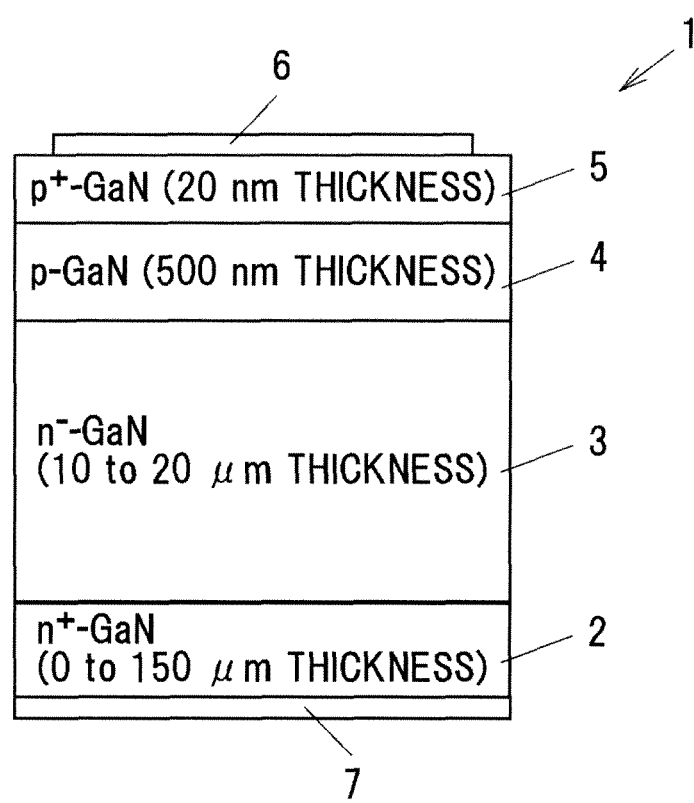
FIG. 2 is a cross-sectional view schematically showing a gallium nitride rectifying device according to one Example of the invention.

FIG. 2 is a cross-sectional view schematically showing a gallium nitride rectifying device according to Examples 1 to 17 of the invention.

At the same condition as that of the above-mentioned embodiment, samples were fabricated, while the $n^+$-type GaN layer 2 in the gallium nitride rectifying device 1 shown in FIG. 2 was changed in thickness in the range of 0 to 150 μm, and the $n^-$-type GaN layer 3 was changed in thickness in the range of 10 to 20 μm, and then characteristics thereof were measured.

Examples 1 to 8

In Examples 1 to 8, the $n^+$-type GaN layer 2 was formed so as to have a thickness of 0 to 150 μm, the $n^-$-type GaN layer 3 was formed so as to have a thickness of 10 to 20 μm, the p-type GaN layer 4 was formed so as to have a thickness of 500 nm, and the $p^+$-type GaN layer 5 was formed so as to have a thickness of 20 nm.

As the carrier trap (level) density, the sum of all of the carrier trap levels observed was used. Measurement was carried out by using Deep Level Transient Spectroscopy (DLTS) method, Light DLTS method and the like. The concentration of Si and the concentration of Mg were determined by Secondary Ion Mass Spectrometry method. Table 1 shows a result that is summarized by that products clearly considered as those due to process defect were omitted, and products having relatively good characteristics were selected from the groups of the measurement result of each type. It was known that differences of characteristics are not dependent on a kind of the substrate material (constituent element and crystalline morphology) such as GaN, SiC, sapphire, Si, but oare dependent on only the carrier trap (level) density existing in the substrate.

As the light emission output, maximum value that was observed by using an integrating sphere and a photo detector when current was applied was used. In a case of not using the integrating sphere, the intensity detected is remarkably weakened in comparison with a case of using it, thus quantitative determination thereof is difficult, but a light emission is observed. Current density is measured while it is changed up to 10 $kA/cm^2$.

In every diode of Conventional Examples 1 to 3, Examples 1 to 8, and Comparative Examples 1, 2, the breakdown voltage was as expected from the breakdown field intensity that is a physical property constant, and in Examples 1 to 8, it was approximately 200 V, and values of characteristics of Conventional Examples 1 to 3 were approximately similar to values presumed from characteristics disclosed in a literature (Y. Yoshizumi, et al., J. Cryst. Growth 298,875 (2007)). With regard to the on resistance, the lowest value of values observed was shown.

In Conventional Examples 1 to 3, the trap level density in the p-type layer was more than $1\times10^{18}$ $cm^{-3}$, and the trap level density in the n-type layer was more than $1\times10^{16}$ $cm^{-3}$, consequently, the on resistance was more than 0.05 $m\Omega cm^2$ and the figure of merit was less than $1.5\times10^9$ $W/cm^2$.

In Examples 1, 2, the trap level density in the n-type layer was more than $1\times10^{16}$ $cm^{-3}$, but the trap level density in the p-type layer was not more than $1\times10^{18}$ $cm^{-3}$ consequently, the on resistance was not more than 0.05 $m\Omega cm^2$ and the figure of merit was not less than $1.5\times10^9$ $W/cm^2$.

In Examples 3, 4, the trap level density in the p-type layer was more than $1\times10^{18}$ $cm^{-3}$, but the trap level density in the n-type layer was not more than $1\times10^{16}$ $cm^{-3}$, consequently, the on resistance was not more than 0.05 $m\Omega cm^2$ and the figure of merit was not less than $1.5\times10^9$ $W/cm^2$.

In Examples 5 to 8, the trap level density in the p-type layer was not more than $1\times10^{18}$ $cm^{-3}$, and the trap level density in the n-type layer was not more than $1\times10^{16}$ $cm^{-3}$, consequently, the on resistance was not more than 0.05 $m\Omega cm^2$ and the figure of merit was not less than $1.5\times10^9$ $W/cm^2$.

In Comparative Examples 1 to 2, the trap level density in the p-type layer was more than $1\times10^{18}$ $cm^{-3}$, and the trap level density in the n-type layer was more than $1\times10^{16}$ $cm^{-3}$, consequently, the figure of merit was less than $1.5\times10^9$ $W/cm^2$.

Figure 4:
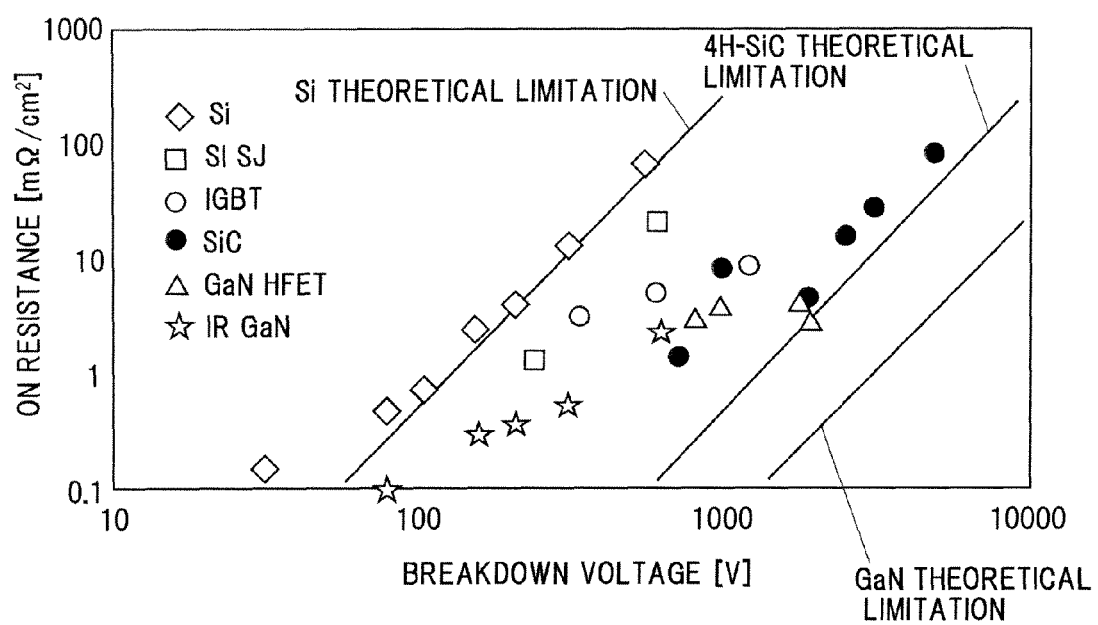
FIG. 4 is a graph showing a relationship in theoretical limitation between a breakdown voltage of the pn junction diode and an on resistance of the device with regard to each material along with actual measured values already reported.

In the devices fabricated in the embodiment having the breakdown voltage of approximately 200 V, as is clear from a trend shown in FIG. 4, unless the on resistance is less than 0.05 $m\Omega cm^2$, there is intrinsically no benefit of adopting this device. If Table 1 is reviewed in consideration of the above-mentioned view point, it is considered that if the carrier trap (level) density in the p-type layer is controlled to not more than $1\times10^{18}$ $cm^{-3}$, or the carrier trap (level) density in the n-type layer is controlled to not more than $1\times10^{16}$ the figure of merit that is calculated by dividing square of the device breakdown voltage by the on resistance becomes more than 1.5 $GW/cm^2$, so that drastic improvement can be achieved in comparison with the conventional devices. More preferably, it has been known that if the carrier trap (level) density in the p-type layer is controlled to not more than $1\times10^{17}$ $cm^{-3}$, and the carrier trap (level) density in the n-type layer is controlled to not more than $1\times10^{15}$ $cm^{-3}$ (Examples 6, 7), and the on resistance is reduced up to around the theoretical value, the figure of merit becomes more than 4 $GW/cm^2$, so that a diode in which loss is extremely lowered can be fabricated.

TABLE 1

| | Trap level density in p-layer (cm$^{-3}$) | Trap level density in n-layer (cm$^{-3}$) | Breakdown voltage Vb (V) | On resistance RonA (mΩ/cm$^2$) | Figure of merit Vb$^2$/RonA (GW/cm$^2$) | Emission intensity (W) | Emission intensity (W/cm$^2$) |
|---|---|---|---|---|---|---|---|
| Conv. Ex. 1 | 4.1 × 10$^{18}$ | 3.6 × 10$^{16}$ | 193 | 0.110 | 0.34 | <8 × 10$^{-11}$ | — |
| Conv. Ex. 2 | 5.0 × 10$^{18}$ | 2.5 × 10$^{16}$ | 205 | 0.220 | 0.19 | <8 × 10$^{-11}$ | — |
| Conv. Ex. 3 | 1.2 × 10$^{18}$ | 1.4 × 10$^{16}$ | 187 | 0.098 | 0.36 | <8 × 10$^{-11}$ | — |
| Example 1 | 8.5 × 10$^{17}$ | 4.6 × 10$^{16}$ | 189 | 0.023 | 1.55 | 1.5 × 10$^{-6}$ | 1.5 × 10$^{-4}$ |
| Example 2 | 9.5 × 10$^{16}$ | 1.3 × 10$^{16}$ | 185 | 0.021 | 1.63 | 3.4 × 10$^{-10}$ | 3.4 × 10$^{-8}$ |
| Example 3 | 1.3 × 10$^{18}$ | 8.7 × 10$^{15}$ | 202 | 0.018 | 2.27 | <8 × 10$^{-11}$ | — |
| Example 4 | 1.1 × 10$^{18}$ | 9.3 × 10$^{14}$ | 221 | 0.021 | 2.33 | 1.2 × 10$^{-10}$ | 1.2 × 10$^{-8}$ |
| Example 5 | 2.5 × 10$^{17}$ | 8.0 × 10$^{14}$ | 234 | 0.017 | 3.22 | 1.4 × 10$^{-10}$ | 1.4 × 10$^{-8}$ |
| Example 6 | 4.6 × 10$^{16}$ | 9.0 × 10$^{14}$ | 221 | 0.011 | 4.44 | <8 × 10$^{-11}$ | — |
| Example 7 | 1.3 × 10$^{15}$ | 3.0 × 10$^{14}$ | 234 | 0.012 | 4.56 | 4.3 × 10$^{-5}$ | 4.3 × 10$^{-3}$ |
| Example 8 | 3.8 × 10$^{17}$ | 5.0 × 10$^{15}$ | 198 | 0.018 | 2.18 | 8.5 × 10$^{-4}$ | 0.084 |
| Com. Ex. 1 | 1.8 × 10$^{18}$ | 1.1 × 10$^{16}$ | 189 | 0.038 | 0.94 | 1.3 × 10$^{-3}$ | 0.13 |
| Com. Ex. 2 | 2.0 × 10$^{18}$ | 2.2 × 10$^{16}$ | 203 | 0.052 | 0.79 | 2.1 × 10$^{-3}$ | 0.21 |

Conv. Ex.: Conventional Example
Com. Ex.: Comparative Example

Furthermore, it is known that the device having a high improvement effect as mentioned above emits a light weakly. As shown in Table 1, there are many devices in which a light emission of not less than 0.1 nW/cm$^2$ as the light emission output is observed. This shows that there is an effect on reducing the on resistance as a parasitic effect associated with the light emission. Probably, it is presumed that it allows the hole of the acceptor level existing in the p-type layer to be excited, and contributes to realization of low resistance. The configuration of Example does not have a structure that is suitable for emitting a light, and even if it emits a light, it does not have a structure that is sufficiently extracting the light emission exteriorly, so that the internal state of the light emission cannot be known, but with regard to the chips in which a light emission of not less than 0.1 nW/cm$^2$ is observed at least in the outside, the on resistance is reduced, so that it is clear that the on resistance is associated with the light emission. Further, it has been known that in case of the device that intensely emits a light of not less than 0.1 nW/cm$^2$, the effect due to the light emission is saturated, or some sort of factor that increases the light emission efficiency acts as a disincentive factor, thereby sufficient improvement of the on resistance is not recognized, and the performance is lowered.

Examples 9 to 17

Table 2 shows an effect obtained by adopting the present invention with regard to the performance of the diode in case that the concentration of the doping impurity is reduced and the breakdown voltage is changed. By using the same multilayer structure and film formation condition as those of Example 1, the n$^-$-type GaN layer 3 and the p-type GaN layer 4 that were different from each other in the doping concentration at several levels were fabricated, and comparison examination was carried out.

TABLE 2

| | N$_A$ (cm$^{-3}$) | N$_{T1}$ (cm$^{-3}$) | N$_{T1}$/N$_A$ (%) | N$_D$ (cm$^{-3}$) | N$_{T2}$ (cm$^{-3}$) | N$_{T2}$/N$_D$ (%) | Breakdown voltage Vb (V) | On resistance RonA (mΩ/cm$^2$) | Figure of merit Vb$^2$/RonA (GW/cm$^2$) |
|---|---|---|---|---|---|---|---|---|---|
| Conv. Ex. 4 | 2.0 × 10$^{19}$ | 5.0 × 10$^{18}$ | 25 | 2.0 × 10$^{17}$ | 3.6 × 10$^{16}$ | 18 | 193 | 0.11 | 0.34 |
| Conv. Ex. 5 | 2.0 × 10$^{18}$ | 9.0 × 10$^{17}$ | 45 | 1.0 × 10$^{17}$ | 1.1 × 10$^{16}$ | 11 | 335 | 0.22 | 0.51 |
| Conv. Ex. 6 | 1.0 × 10$^{18}$ | 5.2 × 10$^{17}$ | 52 | 2.0 × 10$^{16}$ | 9.0 × 10$^{15}$ | 45 | 1200 | 3.3 | 0.44 |
| Conv. Ex. 7 | 5.0 × 10$^{17}$ | 3.1 × 10$^{17}$ | 62 | 1.0 × 10$^{15}$ | 5.0 × 10$^{15}$ | 50 | 4480 | 31.8 | 0.63 |
| Example 9 | 2.0 × 10$^{18}$ | 6.5 × 10$^{17}$ | 33 | 2.0 × 10$^{16}$ | 9.0 × 10$^{15}$ | 45 | 1180 | 0.76 | 1.83 |
| Example 10 | 1.0 × 10$^{18}$ | 2.8 × 10$^{17}$ | 28 | | | 45 | 1210 | 0.8 | 1.83 |
| Example 11 | 5.0 × 10$^{17}$ | 8.3 × 10$^{16}$ | 17 | | | 45 | 1230 | 0.84 | 1.80 |
| Example 12 | 2.0 × 10$^{18}$ | 9.0 × 10$^{17}$ | 45 | 2.0 × 10$^{17}$ | 8.5 × 10$^{15}$ | 4 | 213 | 0.02 | 2.27 |
| Example 13 | | | 45 | 1.0 × 10$^{17}$ | 9.2 × 10$^{15}$ | 9 | 338 | 0.065 | 1.76 |
| Example 14 | | | 45 | 1.0 × 10$^{16}$ | 3.4 × 10$^{15}$ | 34 | 4450 | 9.7 | 2.04 |
| Example 15 | 2.0 × 10$^{19}$ | 8.0 × 10$^{16}$ | 0 | 2.0 × 10$^{17}$ | 8.0 × 10$^{15}$ | 4 | 203 | 0.01 | 4.12 |
| Example 16 | 2.0 × 10$^{18}$ | 9.7 × 10$^{16}$ | 5 | 1.0 × 10$^{17}$ | 5.6 × 10$^{14}$ | 1 | 364 | 0.028 | 4.73 |
| Example 17 | 2.0 × 10$^{17}$ | 6.0 × 10$^{16}$ | 30 | 1.0 × 10$^{16}$ | 3.2 × 10$^{15}$ | 32 | 4380 | 4.6 | 4.17 |

Conv. Ex.: Conventional Example
N$_A$: Concentration of acceptor impurity in p-layer
N$_{T1}$: Trap level density in p-layer
N$_D$: Concentration of donor impurity in n-layer
N$_{T2}$: Trap level density in n-layer As shown in Table 2, in the conventional method, the breakdown voltage is improved by lowering the doping concentration, but the on resistance is increased, and the performance is not improved. It is considered that this is due to the fact that the trap level density dominantly acts on the figure of merit. In addition, as is clear from Table 2, from a quantitative standpoint, even though the carrier trap (level) density (N$_{T1}$) in the p-type layer is controlled to not more than 1×10$^{18}$ cm$^{-3}$, and the carrier trap (level) density (N$_{T2}$) in the n-type layer is controlled to not more than 1×10$^{16}$ cm$^{-3}$, that alone is not enough, and it is necessary to suppress the carrier trap (level)

density so as to be controlled to not more than approximately 35% of the concentration of doped impurity in the layer (the concentration ($N_A$) of the acceptor impurity in the p-type layer, the concentration ($N_D$) of the donor impurity in the n-type layer). This is considered to be a necessary condition for the carrier discharged from the doping impurity to effectively act, but the reason is not clear. As shown in Examples 9 to 17, if any one of ($N_{T1}/N_A$) and ($N_{T2}/N_D$) is controlled to not more than 35%, the figure of merit of not less than 1.5 GW/cm² was obtained. As shown in Examples 15 to 17, if both of ($N_{T1}/N_A$) and ($N_{T2}/N_D$) are controlled to not more than 35%, the figure of merit of not less than 4 GW/cm² was obtained.

Examples 18, 19 were AlGaN type, and each epitaxial layer was composed of the n⁺-type AlGaN layer 2, the n⁻-type AlGaN layer 3, the p-type AlGaN layer 4 and the p⁺-type AlGaN layer 5 respectively. Examples 20, 21 were InGaN type, and each epitaxial layer was composed of the n⁺-type InGaN layer 2, the n⁻-type InGaN layer 3, the p-type InGaN layer 4 and the p⁺-type InGaN layer 5 respectively. Examples 22, 23 were AlInGaN type, and each epitaxial layer was composed of the n⁺-type AlInGaN layer 2, the n⁻-type AlInGaN layer 3, the p-type AlInGaN layer 4 and the p⁺-type AlInGaN layer 5 respectively. The epitaxial layer in Examples 18 to 23 has the same thickness as the epitaxial layer in Conventional Example 8.

TABLE 3

|  | Type | Trap level density in p-layer (cm⁻³) | Trap level density in n-layer (cm⁻³) | Breakdown voltage Vb (V) | On resistance RonA (mΩ/cm²) | Figure of merit Vb²/RonA (GW/cm²) | Emission intensity (W) |
|---|---|---|---|---|---|---|---|
| Conv. Ex. 8 | GaN | $4.1 \times 10^{18}$ | $3.6 \times 10^{16}$ | 193 | 0.11 | 0.34 | $<8 \times 10^{-11}$ |
| Conv. Ex. 9 | AlGaN | $5.9 \times 10^{18}$ | $1.3 \times 10^{16}$ | 230 | 0.3 | 0.18 | $<8 \times 10^{-11}$ |
| Conv. Ex. 10 | InGaN | $1.2 \times 10^{18}$ | $3.5 \times 10^{16}$ | 150 | 0.08 | 0.28 | $<8 \times 10^{-11}$ |
| Example 18 | AlGaN (1) | $9.3 \times 10^{16}$ | $6.6 \times 10^{15}$ | 234 | 0.025 | 2.19 | $2 \times 10^{-10}$ |
| Example 19 | AlGaN (2) | $7.5 \times 10^{17}$ | $9.7 \times 10^{14}$ | 227 | 0.032 | 1.61 | $3 \times 10^{-10}$ |
| Example 20 | InGaN (1) | $3.5 \times 10^{17}$ | $9.3 \times 10^{14}$ | 187 | 0.008 | 4.37 | $6 \times 10^{-6}$ |
| Example 21 | InGaN (2) | $2.6 \times 10^{16}$ | $4.0 \times 10^{15}$ | 179 | 0.0068 | 4.71 | $8 \times 10^{-5}$ |
| Example 22 | AlInGaN (1) | $9.7 \times 10^{16}$ | $5.6 \times 10^{15}$ | 221 | 0.022 | 2.22 | $2.5 \times 10^{-10}$ |
| Example 23 | AlInGaN (2) | $1.2 \times 10^{16}$ | $8.9 \times 10^{14}$ | 210 | 0.011 | 4.01 | $<8 \times 10^{-11}$ |

Conv. Ex.: Conventional Example

With regard to the sample in which the trap density was reduced based on the present invention, a light emission was observed in every sample, and the on resistance was reduced. Further, the light emission was not observed in the sample of conventional type.

Examples 18 to 23

Figure 3:
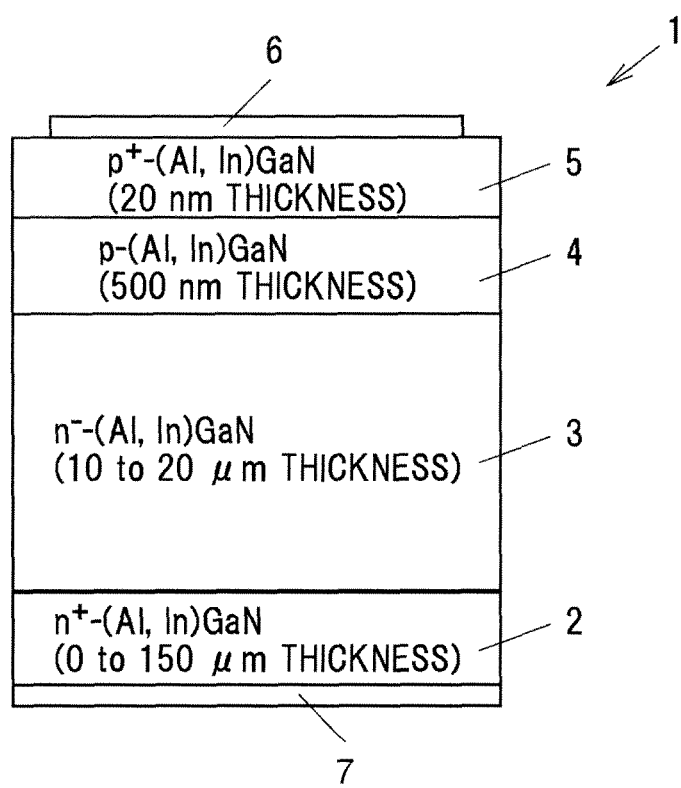
FIG. 3 is a cross-sectional view schematically showing a gallium nitride rectifying device according to another Example of the invention.

FIG. 3 is a cross-sectional view schematically showing a gallium nitride rectifying device according to Examples 18 to 23 of the invention.

For the purpose of investigating an effect in an AlGaN mixed crystal and an InGaN mixed crystal, an epitaxial film was grown by using MOVPE method or HVPE method that uses an ammonia gas, and an organic Ga material, an organic Al and an organic In material, or a Ga chloride, an Al chloride and an In chloride, or HVPE method that uses also an organic metal material, and the device was fabricated similarly to Example 1. As shown in FIG. 3, the device has a structure that GaN is replaced with AlGaN, InGaN or AlInGaN respectively. Al composition was designed as 0.1 to 0.3 and In composition was designed as 0.1 to 0.4.

Conventional Example 8 was GaN type, and each epitaxial layer was composed of the n⁺-type GaN layer 2 of 0 to 150 μm in thickness, the n⁻-type GaN layer 3 of 10 to 20 μm in thickness, the p-type GaN layer 4 of 500 nm in thickness and the p⁺-type GaN layer 5 of 20 nm in thickness respectively. Conventional Example 9 was AlGaN type, and each epitaxial layer was composed of the n⁺-type AlGaN layer 2, the n⁻-type AlGaN layer 3, the p-type AlGaN layer 4 and the p⁺-type AlGaN layer 5 respectively. Conventional Example 10 was InGaN type, and each epitaxial layer was composed of the n⁺-type InGaN layer 2, the n⁻-type InGaN layer 3, the p-type InGaN layer 4 and the p⁺-type InGaN layer 5 respectively. The epitaxial layer in Conventional Examples 9, 10 has the same thickness as the epitaxial layer in Conventional Example 8.

When each of the layer 2 to 5 was epitaxially grown, first, a buffer layer (fifth layer) including GaN was appropriately grown on the substrate, and the substrate was removed at the fabrication of the device similarly to Example 1. The p-type layers and the n-type layers in which the film thickness and the doping concentration were set similarly to Example 1 were epitaxially grown thereon, and gallium nitride rectifying devices corresponding to the epitaxial films grown under various growth conditions were fabricated, and characteristics thereof were measured. From the devices, those having relatively good characteristics were extracted. Tables 3 shows the result.

As a result, these cases have the same trend as the case of GaN (Examples 5 to 8 in Table 1), and the trap density highly acted thereon, and weak light emission was observed. Association with the Al composition and the In composition was not clearly observed.

INDUSTRIAL APPLICABILITY

The present invention can be applied for all of the electronic devices that have the pn junction, such as npn type bipolar transistor, pnp type bipolar transistor, npnp type thyristor, npn type or pnp type Metal-Oxide Semiconductor Field-Effect Transistor (MOSFET), Junction Field Effect Transistor (JFET), Gate Turn-Off Thyristor (GTO), Insulated Gate Bipolar Transistor (IGBT). In addition, when these devices are fabricated by using the gallium nitride based semiconductor, drastic improvement in performance can be expected.

Although the invention has been described with respect to the specific embodiments for complete and clear disclosure, the appended claims are not to be thus limited but are to be construed as embodying all modifications and alternative constructions that may occur to one skilled in the art which fairly fall within the basic teaching herein set forth.

What is claimed is:

1. A gallium nitride rectifying device, comprising:
a p-type gallium nitride based semiconductor layer and an n-type gallium nitride based semiconductor layer, the two layers forming a pn junction with each other; and
wherein the p-type gallium nitride based semiconductor layer has a carrier trap (level) density of not more than $1\times10^{18}$ cm$^{-3}$, and the n-type gallium nitride based semiconductor layer has a carrier trap (level) density of not more than $1\times10^{16}$ cm$^{-3}$.

2. A gallium nitride rectifying device, comprising:
a p-type gallium nitride based semiconductor layer and an n-type gallium nitride based semiconductor layer, the two layers forming a pn junction with each other; and
wherein the p-type gallium nitride based semiconductor layer has a carrier trap (level) density of not more than $1\times10^{17}$ cm$^{-3}$, and the n-type gallium nitride based semiconductor layer has a carrier trap (level) density of not more than $1\times10^{15}$ cm$^{-3}$.

3. A gallium nitride rectifying device, comprising:
a p-type gallium nitride based semiconductor layer and an n-type gallium nitride based semiconductor layer, the two layers forming a pn junction with each other;
wherein the p-type gallium nitride based semiconductor layer has a carrier trap (level) density of not more than $1\times10^{18}$ cm$^{-3}$, or the n-type gallium nitride based semiconductor layer has a carrier trap (level) density of not more than $1\times10^{16}$ cm$^{-3}$; and
wherein the p-type gallium nitride based semiconductor layer has the carrier trap (level) density of not more than 35% of a concentration of doped acceptor impurity, and the n-type gallium nitride based semiconductor layer has the carrier trap (level) density of not more than 35% of a concentration of doped donor impurity.

4. A gallium nitride rectifying device, comprising:
a p-type gallium nitride based semiconductor layer and an n-type gallium nitride based semiconductor layer, the two layers forming a pn junction with each other;
wherein the p-type gallium nitride based semiconductor layer has a carrier trap (level) density of not more than $1\times10^{18}$ cm$^{-3}$, or the n-type gallium nitride based semiconductor layer has a carrier trap (level) density of not more than $1\times10^{16}$ cm$^{-3}$;
wherein the gallium nitride rectifying device is configured to be capable of emitting a light by power distribution; and
wherein the light output by the power distribution is more than 0.1 nW/cm$^2$, and less than 0.1 W/cm$^2$.

5. A gallium nitride rectifying device, comprising:
a p-type gallium nitride based semiconductor layer and an n-type gallium nitride based semiconductor layer, the two layers forming a pn junction with each other;
wherein the p-type gallium nitride based semiconductor layer has a carrier trap (level) density of not more than $1\times10^{18}$ cm$^{-3}$, or the n-type gallium nitride based semiconductor layer has a carrier trap (level) density of not more than $1\times10^{16}$ cm$^{-3}$;
wherein the gallium nitride rectifying device is configured to have a figure of merit of not less than $1.5\times10^9$ W/cm$^2$, where the figure of merit is calculated by dividing square of a device breakdown voltage by an on resistance.

6. A gallium nitride rectifying device, comprising:
a p-type gallium nitride based semiconductor layer and an n-type gallium nitride based semiconductor layer, the two layers forming a pn junction with each other;
wherein the p-type gallium nitride based semiconductor layer has a carrier trap (level) density of not more than $1\times10^{18}$ cm$^{-3}$, or the n-type gallium nitride based semiconductor layer has a carrier trap (level) density of not more than $1\times10^{16}$ cm$^{-3}$; and
wherein the gallium nitride rectifying device is configured to have a figure of merit of not less than $4\times10^9$ W/cm$^2$, where the figure of merit is calculated by dividing square of a device breakdown voltage by an on resistance.

* * * * *